United States Patent [19]

Jain et al.

[11] 4,444,456

[45] Apr. 24, 1984

[54] HOLOGRAPHIC METHOD AND APPARATUS FOR TRANSFORMATION OF A LIGHT BEAM INTO A LINE SOURCE OF REQUIRED CURVATURE AND FINITE NUMERICAL APERTURE

[75] Inventors: Kantilal Jain; Milton R. Latta; Glenn T. Sincerbox, all of San Jose, Calif.

[73] Assignee: International Business Machines, Armonk, N.Y.

[21] Appl. No.: 391,100

[22] Filed: Jun. 23, 1982

[51] Int. Cl.³ .............................................. G02B 5/32
[52] U.S. Cl. ...................................................... 350/3.7
[58] Field of Search .................. 350/3.7, 3.83, 3.6, 350/3.75, 1.1

[56] References Cited

U.S. PATENT DOCUMENTS

| | | | |
|---|---|---|---|
| 3,578,845 | 5/1971 | Brooks | 350/162.3 |
| 3,630,593 | 12/1971 | Bartelt | 350/3.5 |
| 3,652,144 | 3/1972 | Vander Lugt | 350/3.5 |
| 3,708,217 | 1/1973 | McMahon | 350/3.7 |
| 4,012,150 | 3/1977 | Upatnieks | 356/247 |

FOREIGN PATENT DOCUMENTS

1387022 3/1975 United Kingdom .

OTHER PUBLICATIONS

Smith, W. J., *Modern Optical Engineering,* p. 132, McGraw-Hill, New York, 1966.

*Primary Examiner*—Bruce Y. Arnold
*Attorney, Agent, or Firm*—Otto Schmid, Jr.

[57] ABSTRACT

Apparatus for producing a line source of a desired shape from a radiation source such as a laser comprising means for directing the radiation source along a predetermined path as a playback beam to impinge upon a hologram at a predetermined angle to produce a continuous self-luminous source of the desired shape. The hologram is recorded upon a substrate coated with a photosensitive material by interference between recording and object beams derived from the same source of coherent radiation. The recording beam is directed toward the substrate at an orientation and angle so that the playback beam is a conjugate of the recording beam. The object beam is directed to the substrate over a path which includes a diffuser plate covered with an opaque material in all areas except for a continuation area which defines the desired shape. The part of the object beam which impinges upon the substrate is limited by an aperture comprising a sector of an annulus which defines the numerical aperture of the radiation source.

5 Claims, 8 Drawing Figures

HOLOGRAPHIC METHOD AND APPARATUS FOR TRANSFORMATION OF A LIGHT BEAM INTO A LINE SOURCE OF REQUIRED CURVATURE AND FINITE NUMERICAL APERTURE

DESCRIPTION

BACKGROUND OF THE INVENTION

1. Field of the Invention

This invention relates to optical imaging systems and specifically concerns a holographic illumination system to create a continuous self-luminous source of arbitrary shape and numerical aperture.

2. Description of the Prior Art

The drive toward higher density circuitry in microelectronic devices has promoted interest in a variety of high resolution lithographic techniques which require the ability to produce finer resolution patterns at high production rates. In optical lithography, the improvement in resolution that results by use of shorter wavelengths is well known. As a result of these considerations, an effort has been made to develop processes and materials which require exposure in the deep UV spectral region. The light source traditionally used in these prior art systems has been either a deuterium lamp or a xenon-mercury arc lamp. The problem with using such lamps is that insufficient power is available from them in the desired spectral region. For a typical lamp in a typical system, the total deep UV power than can be collected for use is in the few tens of milliwatts range, so that the exposure time for photoresists that are sensitive in the deep UV are typically several minutes. A copending application Ser. No. 268,511, filed May 29, 1981 by Jain et al, (now abandoned) discloses and claims optical lithography apparatus having a pulsed excimer laser light source. This apparatus is capable of producing uniform exposure of a pattern at very fine resolution in an exposure time substantially faster than prior art systems. The pulsed excimer laser light source disclosed in that application produces a nearly collimated beam which is unsuitable for use in prior art projection systems which have been designed to utilize illumination through an arbitrary shape such as a curved slit.

SUMMARY OF THE INVENTION

It is, therefore, the principal object of this invention to provide apparatus for transforming a beam such as a pulsed laser light beam, for example, into an optically equivalent self-luminous source of arbitrary shape and numerical aperture.

In this application, the term "numerical aperture of a source" is defined as the sine of half of the cone angle spanned by the light rays emanating from each point on the source surface. When the axes of the cones of light rays emitted from various points on the source surface are mutually parallel and normal to the surface, the illumination is termed "telecentric."

Briefly, according to the invention, there is provided apparatus for producing a line source of a desired shape from a monochromatic beam comprising means for directing a monochromatic beam along a predetermined path, means to position a hologram in a fixed position along the predetermined path so that the monochromatic beam impinges upon the hologram at a predetermined angle. The hologram is formed by interference between a first and a second beam derived from the same source of coherent radiation, the first and second beams being directed by first and second optical means to a photosensitive medium, the second optical means including diffuser means preceded by mask means having a central opening having a continuous aperture of the desired shape, the interference between the first and second beam being recorded in the photosensitive medium to produce the hologram. The predetermined angle of the monochromatic beam is chosen so that playback of the recorded hologram produces a continuous self-luminous source of the desired shape.

This invention produces the advantage that pulsed laser sources as well as other monochromatic sources can be easily adapted for use with existing prior art optical lithography systems so that much higher production rates can be achieved from this existing equipment.

DESCRIPTION OF THE PREFERRED EMBODIMENTS

Figure 1A:
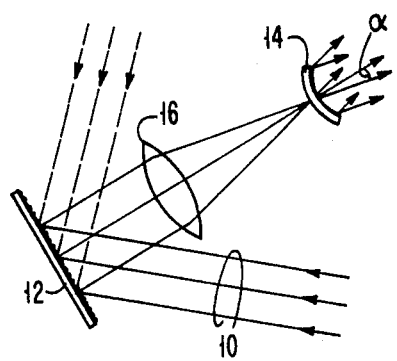
FIG. 1A is a diagrammatic showing of a hologram illumination system for practicing the preferred embodiment of the present invention.

In the specific embodiment of the invention shown in FIG. 1a, a beam 10 from a monochromatic beam is directed along a predetermined path as shown by the arrows to impinge on a hologram 12 which is fixed in position along the predetermined path so that the beam impinges on the hologram at a selected angle. The angle and the beam 10 are selected so that beam 10 is the conjugate of the recording reference beam (shown in dashed line in FIG. 1a) used to record the hologram. The preferred source for beam 10 is an excimer laser. In cases where a field lens was used in recording the hologram, a field lens 16 must also be used in the playback system. In response to beam 10, the pattern 14 of a desired shape and numerical aperture is reconstructed from hologram 10. The pattern of the desired shape is defined when the hologram is fabricated as will be described below.

Figure 1B:
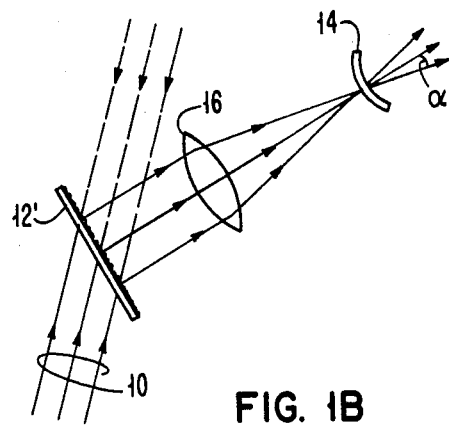
FIG. 1B is a diagrammatic showing of a hologram illumination system for practicing an alternate embodiment of the present invention.

In the embodiment shown in FIG. 1a, hologram 12 is a reflection relief hologram. The system is also operable when using a transmission hologram 12' as shown in FIG. 1b. Note that in each case, beam 10 is the conjugate of the recording reference beam which is shown dotted in FIG. 1b.

Figure 2:
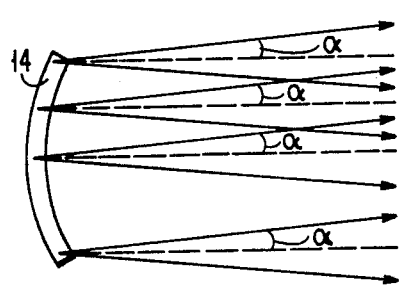
FIG. 2 is a diagram showing the self-luminous curved line source of FIG. 1, each point of which radiates into a finite numerical aperture.

As shown in FIG. 2, the pattern 14 comprises a continuous self-luminous source, each point of which radiates into a finite numerical aperture defined by the cone of radiation of cone angle $\alpha$. The curved arc shape of the pattern in this specific embodiment is chosen to match the shape produced by the light source for an exising projection lithography tool. By removing the prior art light source, and coupling pattern 14 into the tool in place of the light source designed for the tool, the prior art tool can be operated with exposure times about two orders of magnitude less than the times required when using the projection tool as originally designed.

Figure 3:
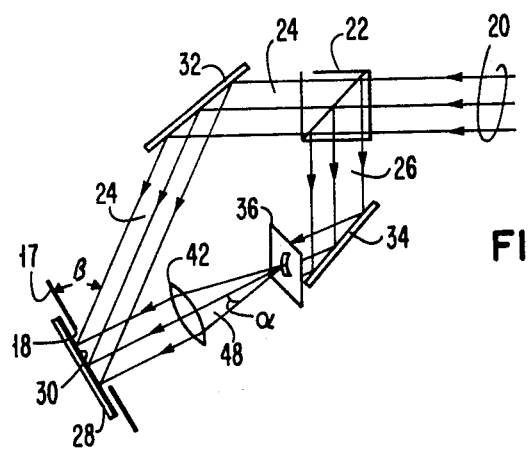
FIG. 3 is a schematic diagram of the optical system for producing the hologram used in the system of FIG. 1.
Figure 4:
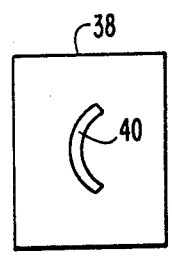
FIG. 4 is a diagram showing in greater detail the diffuser plate of FIG. 3.

One apparatus and method for fabricating hologram 12 is shown in FIG. 3. The apparatus utilizes an input beam 20 which must be temporally and spatially coherent. The preferred light source for beam 20 is a cw frequency doubled dye laser chosen so that its operating wavelength is the same as the wavelength of the light source to be used in playback such as beam 10 in FIG. 1. Input beam 20 is directed to a conventional beamsplitter 22 which divides beam 20 into a recording reference beam 24 and an object beam 26. A suitable substrate 28, upon which hologram 12 is formed, is fixed in position and provided with a coating 30 of a photosensitive material such as a conventional photoresist material, for example. A mask member 17 having an aperture 18 to define the desired numerical aperture of the radiation source is mounted adjacent to the coated substrate 28. Recording reference beam 24 is directed toward the photoresist covered substrate over a first path which includes a reflective element 32 so that recording reference beam 24 impinges on the substrate at an angle $\beta$. The object beam 26 is directed over a second optical path which includes reflective element 34 to direct the beam to a diffuser plate 36. The diffuser plate (see FIG. 4) is made from a suitable scattering plate 38 such as UV grade quartz with fine scattering centers, for example. Scattering plate 38 is covered with an opaque material in all areas except for the continuous area 40 which defines the desired shape and, in the specific embodiment shown, the desired shape is a curved slit. When the object beam impinges upon diffuser plate 36 (see FIG. 3), it is diffused in all directions but only the light that goes through aperture 18 is effective in recording hologram 12 (see FIG. 1). The curved diffusing area defined by area 40 (see FIG. 4) now acts as a self-luminous source radiating into a large solid angle. However, the aperture 18 limits the numerical aperture of the radiation source to the chosen value so that only portion 48 of beam 26 is used in recording the hologram. The interference between beams 24 and 48 produces an interference pattern which exposes the photoresist material. After development, the interference pattern acts as a relief hologram. A reflective coating such as a thin layer of aluminum, for example, is then deposited on the surface of the hologram to form a reflection relief hologram. If desired, the hologram can further be protected by an appropriate overcoat such as magnesium fluoride, for example.

Figure 5:
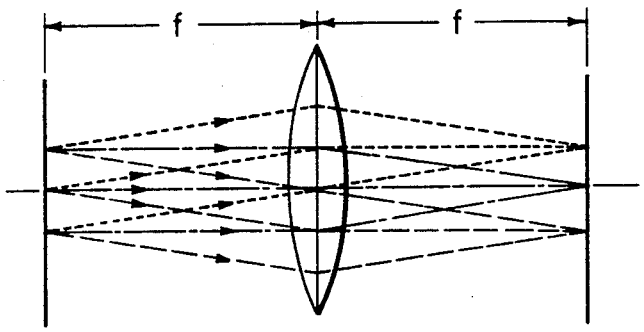
FIG. 5 is a diagram which shows the effect of the field lens in recording the hologram using the system of FIG. 3.

Some commercial projection lithography systems are designed with the requirement of telecentricity for the light source. To produce a light source usable with such systems, a field lens 42 is positioned within the path of the object beam substantially midway between diffuser plate 36 and the hologram 12 surface so that the diffuser plate 36 and hologram 12 surface are located in the front and back focal planes of the lens 42. The diffuser plate produces a series of point sources, each point of which radiates into a finite numerical aperture. Three points are shown in FIG. 5, each of which radiates a cone of light having its principal ray substantially perpendicular to the diffuser screen surface. The upper point produces a cone of light (shown dotted in the drawing) which is directed by field lens 42 to the hologram at an angle. Note that the principal ray and the outer rays are all parallel as they approach the hologram. The central point (shown as a dot dashed line in the drawing) has its principal ray unaffected by the field lens and the outer rays are parallel to the principal ray. Likewise, the lower point (shown in dash lines in the drawing) has its principal ray and the outer rays directed at an angle by the field lens so that they are parallel as they approach the hologram surface. During playback, the reconstructed points produce rays as shown in the drawing so that the rays converge to a point in the plane of the diffuser plate with the principal ray perpendicular to the plane of the diffuser plate. This reconstructed beam is operable with those systems which have a telecentricity requirement for the light source.

Figure 6:
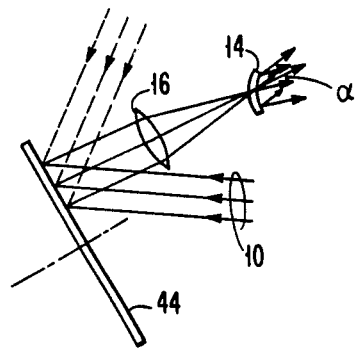
FIG. 6 is a diagrammatic showing of a further embodiment of the invention in which a plurality of holograms are mounted for selective operation.
Figure 7:
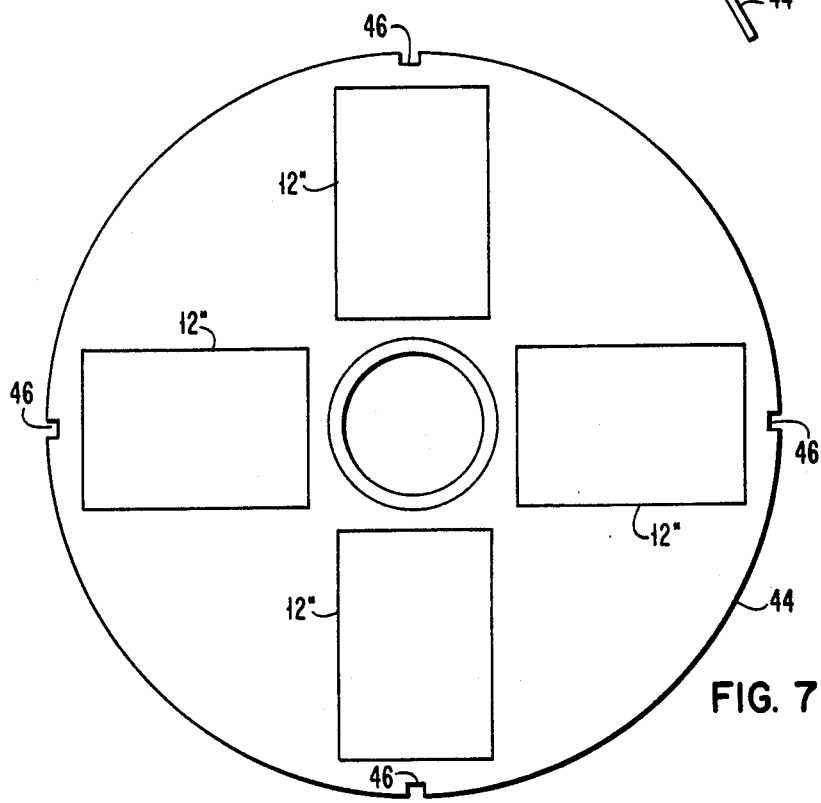
FIG. 7 is a plan view of the rotating disk of FIG. 6.

In the embodiment shown in FIG. 6, a plurality of holograms 12" are mounted on a rotating disk 44. Each of the holograms 12" is preferably recorded with a different numerical aperture. Disk 44 (see FIG. 7) is provided with a series of detent notches 46 so that each of the holograms 12" can be selectively positioned as the operative hologram in the system. The detent mechanism holds the selected hologram 12" in precise alignment with the input light beam 10. By rotating disk 44 to the appropriate position by suitable mechanical or electro-mechanical means (not shown), a hologram of a selected numerical aperture can be selected for use in the lithography system.

While the invention has been particularly shown and described with reference to a preferred embodiment thereof, it will be understood by those skilled in the art that various other changes in the form and details may be made therein without departing from the spirit and scope of the invention.

Having thus described our invention, what we claim as new and desire to secure by Letters Patent is:

1. Apparatus for producing a radiation source of a desired shape and numerical aperture from a monochromatic beam comprising:
   means for directing the monochromatic beam along a predetermined path;
   means to position a hologram in a fixed position along said predetermined path so that the chief ray of said monochromatic beam impinges upon said hologram at a predetermined angle, said hologram formed by interference between a first recording beam and a second recording beam, both said first and said second recording beams derived from the same source of coherent radiation, said first and said second recording beams being directed by first and second optical means to a photosensitive medium, said second optical means comprising diffuser means preceded by mask means having a central opening having a continuous aperture of the desired shape comprising a sector of an annulus, said interference between said first and said second recording beams being recorded in said photosensitive medium to produce said hologram;
   said predetermined angle of said chief ray of said monochromatic beam being chosen to be conjugate to said first recording beam so that playback of said recorded hologram produces a continuous self-luminous source of said desired shape and numerical aperture.

2. The apparatus of claim 1 wherein said monochromatic beam is the output of an excimer laser.

3. The apparatus of claim 1 wherein said hologram is a reflection hologram.

4. The apparatus of claim 1 wherein said radiation source of said desired shape is telecentric and wherein said first beam for recording said hologram and said monochromatic beam for playback of said recorded hologram are both incident on said hologram through a field lens.

5. Apparatus for producing a radiation source of a desired shape and numerical aperture from a monochromatic beam comprising:
   means for directing the monochromatic beam along a predetermined path;
   means to mount a plurality of holograms so that each hologram of said plurality can be selectively moved to the position along said predetermined path whereby the chief ray of said radiation source impinges upon said hologram at a predetermined angle, each of said plurality of holograms being formed by interference between a first recording beam and a second recording beam, both said first recording beam and said second recording beam being derived from the same source of coherent radiation, said first and said second recording beams being directed by first and second optical means to a photosensitive medium, said second optical means comprising diffuser means preceded by mask means having a central opening having a continuous aperture of the desired shape comprising a sector of an annulus, said interference between said first and said second recording beams being recorded in said photosensitive medium to produce said hologram, each of said holograms being recorded with a different finite numerical aperture;
   said predetermined angle of said chief ray of said monochromatic beam being chosen to be conjugate to said first recording beam so that playback of said recorded hologram produces a continuous self-luminous source of said desired shape and numerical aperture.

* * * * *